United States Patent [19]

Hansson et al.

[11] Patent Number: 5,513,593
[45] Date of Patent: May 7, 1996

[54] LIQUID-PHASE HETEROEPITAXY METHOD

[75] Inventors: Per-Ove Hansson, Stuttgart; Martin Albrecht, Hamburg, both of Germany

[73] Assignee: Max-Planck-Gesellschaft zur Foerderung der Wissenschaften e.V., Munich, Germany

[21] Appl. No.: 221,198

[22] Filed: Mar. 31, 1994

[30] Foreign Application Priority Data

Mar. 31, 1993 [DE] Germany ............................ 43 10 612.9

[51] Int. Cl.$^6$ .................................................... H01L 21/20
[52] U.S. Cl. ................... 117/56; 117/936; 437/130
[58] Field of Search ....................... 437/81, 130; 117/54, 117/58, 61, 59, 60, 64, 936, 56

[56] References Cited

U.S. PATENT DOCUMENTS

| | | | |
|---|---|---|---|
| 3,530,011 | 9/1970 | Suzuki et al. | 117/58 |
| 4,201,623 | 5/1980 | Sumner | 117/61 |
| 4,357,183 | 11/1982 | Fan et al. | 117/936 |
| 4,373,989 | 2/1983 | Mattauch et al. | 117/58 |
| 4,876,210 | 10/1989 | Barnett et al. | 437/5 |

FOREIGN PATENT DOCUMENTS

| | | |
|---|---|---|
| 2144828 | 3/1972 | Germany . |
| 2247710 | 4/1974 | Germany . |

OTHER PUBLICATIONS

"Selective Area Solution Growth of Ge and GaAs on Si" by Zolper et al.; J.Appl. Phys. 66(1), Jul. 1, 1989, pp. 210–214.
"Liquid–Phase Epitaxy and Characterization of $Si_{1-x}Ge_x$ layers on Si Substrates" by Hansson et al.; J.Appl. Phys. 68(5), Sep. 1, 1990, pp. 2158–2163.
"Two–Dimensional Growth of Strained $Ge_{0.85}Si_{0.15}$ on Si(111) By Liquid Phase Epitaxy" by Hansson et al.; J.Appl. Phys. 72(5), Sep. 1, 1992, pp. 2083–2085.
"Thickness and Surface Morphology of GaAs LPE Layers Grown By Supercooling, Step–Cooling, Equilibrium–Cooling, and Two–Phase Solution Techniques" by J. J. Hsieh; Journal of Crystal Growth 27 (1974), pp. 49–61.
"Fundamental Issues in Heteroepitaxy–A Department of Energy, Council on Materials Science Panel Report" by E. G. Bauer et al., J. Mater. Res., 5, No. 4, Apr. 1990 pp. 852–894.

Primary Examiner—R. Bruce Breneman
Assistant Examiner—Linda J. Fleck
Attorney, Agent, or Firm—Brumbaugh, Graves, Donohue & Raymond

[57] ABSTRACT

To produce a layer by liquid-phase heteroepitaxy a molten metal serving as the solvent is saturated at a first temperature with substrate material and compounded with layer material. The solution and the substrate are then separately "overheated" to a second, higher temperature and then brought into contact with each other. Due to the overheating a negative thermodynamic driving force results for the epitaxy which compensates the positive driving force for the epitaxy at least in part due to the different interfacial energies between layer material and solution and substrate material and solution. The degree of overheating determines the resulting total driving force for the epitaxy which may be reduced to zero. Very thin layers, down to a monolayer thickness may be grown in this way from the solution with a layer thickness exact to a monolayer with no dislocation.

3 Claims, 1 Drawing Sheet

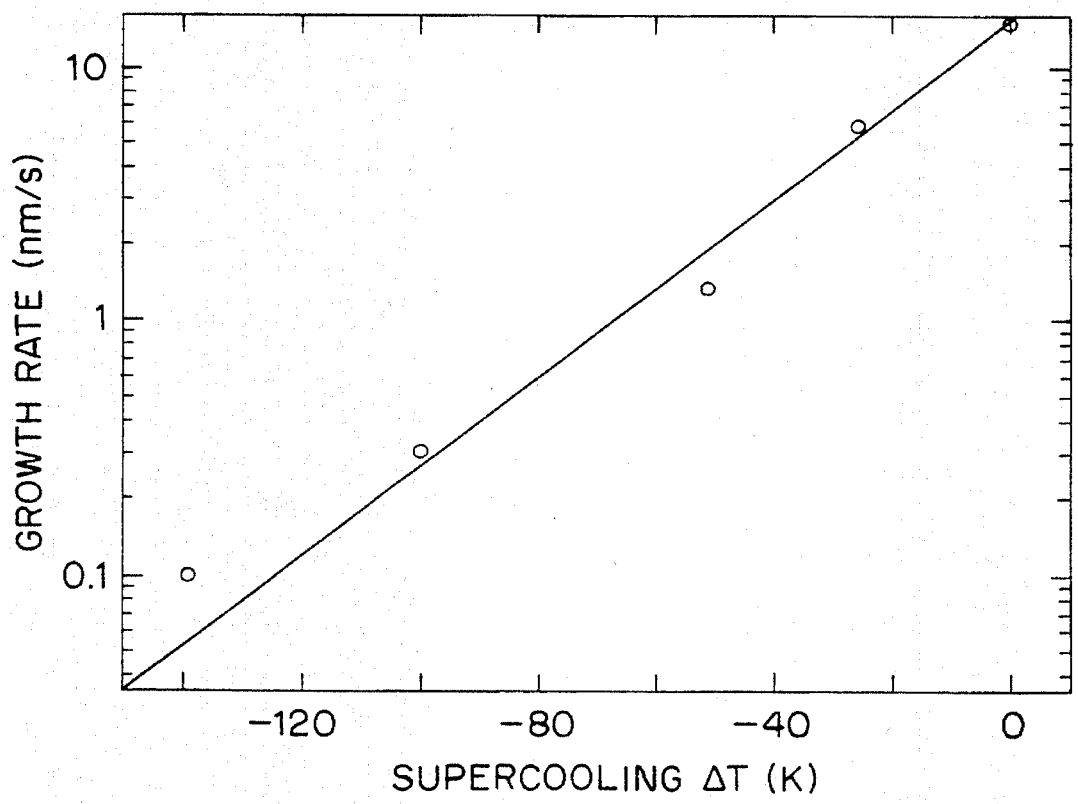

LIQUID-PHASE HETEROEPITAXY METHOD

FIELD OF THE INVENTION

The present invention relates to a liquid-phase heteroepitaxy method, i.e. a method of depositing a layer of a given layer material on a surface of a substrate of a substrate material other than that of the layer material, in which a solution containing the layer material dissolved in a solvent is brought into contact with a surface of the substrate.

Description of the Related Art

In liquid-phase epitaxy (LPE) it is usually the case that a supercooled solution of the layer material in the solvent is brought into contact with the substrate surface, see e.g. Hansson et al, J. Appl. Phys. 72 (5), 1st. September 1992, pages 2083–2085; Hsieh, Journal of Crystal Growth 27 (1974), pages 49–61; Bauer et al, J. Mater. Res., 5, No. 4, April 1990, pages 852–894.

Liquid-phase epitaxy methods are used among other things for the fabrication of strained Si-Ge layer structures e.g. for heterojunction bipolar transistors (HBT) holding the promise of a higher gain-bandwidth product than the classic bipolar silicon transistors and which are cheaper to fabricate than HBT of AlGaAs/GaAs and GaInAs/InP heterostructures.

In known epitaxy methods including LPE it is, however, very difficult to produce thin semiconductor layers of a given thickness which are practically dislocation-free.

Strained epitaxial layers become metastable at low growth temperatures. At high temperatures (above roughly 700° C.) a two-dimensional growth was hitherto unattainable.

SUMMARY OF THE INVENTION

The present invention is accordingly based on the object of providing a liquid-phase heteroepitaxy method for the controlled growth of thin semiconductor layers of a precisely adjustable thickness which are thermally stable up to the melting temperature of the layer material and practically dislocation-free.

This object is achieved by a method of the aforementioned kind which is characterized in that the solvent at a given first temperature T1 between the melting point of the solvent and by a certain amount below the melting point of the layer material (and of the melting temperature of the substrate material) is saturated with the substrate material and compounded with the layer material and in that the solution produced by such means and the substrate are heated separately to a second temperature T2, which is higher than the first, but lower than the melting temperature of the layer material or roughly equal to this melting temperature, the solution being brought into contact at this second temperature with the substrate surface to be coated and whereby the second temperature and the duration of bringing into contact is selected so that a desired thickness of the layer material deposited on the substrate surface is achieved.

For depositing a layer on a substrate a positive thermodynamic driving force is necessary in principle. This positive thermodynamic driving force is proportional to the difference in the interfacial energies between solvent/substrate and solvent/layer material. (The interfacial energy is the difference in the surface energies of the solid and solution when the solution wets the solid). The requirement for a layer forming on the substrate is that the surface energy of the solution is smaller than that of the layer and that of the layer is smaller than that of the substrate.

Due to the "overheating" of the solution saturated with the substrate material at the first temperature a negative thermodynamic driving force results for the epitaxy. This negative driving force opposes the positive driving force for the epitaxy resulting from the difference in the interfacial energies between layer material and solution and substrate material and solution. The degree of overheating determines the resulting total driving force for the epitaxy. The latter may be reduced to zero. By means of the present invention adjusting the layer thickness down to a thickness in the range of monolayers is precisely possible to one monolayer. The produced material is thermally stable up to the melting temperature of the layer material.

BRIEF DESCRIPTION OF THE DRAWING

The FIGURE shows the growth rate for Ge layers on Si (111) from a Bi solution as a function of the supercooling.

DESCRIPTION OF THE PREFERRED EMBODIMENTS

One preferred embodiment are thin, strained epitaxial layers having no dislocations, e.g. Ge-Si layer structures.

As the solvent any material will do, having at the second temperature T2—the "growth temperature" or the "overheating temperature"—in the liquid state a surface energy which is smaller than that of the layer material and that of the substrate material. The solvent must, of course, be liquid at the growth temperature and exhibit an adequate solubility for the substrate and layer material, in addition to having no undesirable properties such as radioactivity. The melting point of the solvent must be lower than that of the substrate material. The surface energy of the layer material must also be smaller than or equal to that of the substrate material.

The method is not restricted to monocrystalline substrates, polycrystalline substrates may also be coated therewith. The sequence in saturating the solvent at the given first temperature T1 with the substrate material and of introducing the layer material into the solution can be any.

In the case of silicon as the substrate material and germanium as the layer material the solvents may be e.g. the metals Bi, Ga, In, Pb, Sb and Sn as well as alloys of the cited metals with each other or with other metals having a higher surface energy and/or solubility for Ge and Si, e.g. Au, Ag. Due to the fact that the temperature dependency of the surface energy differs in the solid state, Ga and Sn are suitable only for growth temperatures below roughly 300° C.

Saturation occurs at a first temperature in the interval solvent metal melting point thru Ge melting point (937° C.), the growth temperatures also being in this range.

The layer thickness depends not only on the degree of overheating T1–T2, but also on the absolute value of the growth temperature T2, the quantity of the layer material contained in the solution and on the growth time.

The solution may also contain a dopant.

In the Bi-Ge-Si system at a growth temperature T2 of 920° C. growth ceases at an overheating of more than 300° C., i.e. the saturation temperature T1 being smaller than 620° C. in this case. For a growth time of 40 seconds and a material quantity of 7 g Bi as the solvent and 0.3 g Ge as the layer material the layer thickness varies more or less linearly from 0 thru 5 nm for "overheatings" from 300° C. thru 130° C.

The FIGURE shows the growth rate for Ge layers on Si (111) from a solution of Bi as a function of the supercooling. In this case the saturation temperature T1 amounts to 780° C. Various supercooling temperatures T=T1–T2<0 were tried out, T2 being the growth temperature. The points were derived from experiment; the line being an expedient. The quantities of the material used (in units of mass) amounted to 7 g for Bi and roughly 250 mg for Ge.

For an In-Ge/Si(001) system the Ge layer thickness varies between 0 and 4 monolayers for "supercoolings" from –10° C. thru 0° C. at a growth temperature T2 of 500° C. and growth times exceeding 30 secs. In this case the quantities of the material used (in units of mass) are 100 g for In and 6 g for Ge.

Examples of further solvent/layer material/substrate material systems are listed in the following table:

| Solvent | Layer Material | Substrate Material |
|---|---|---|
| Ga | GaAs | AlGaAs |
| In | GaAs | AlGaAs |
| Ga | InGaAs | InP |
| In | InGaAs | InP |

As the solvent all materials can be used which satisfy the above requirements, i.e. except metals e.g. also semi-metals such as Se and Te and others. However, metals are preferred in general.

What is claimed is:

1. A liquid-phase heteroepitaxy method for depositing a layer of a layer material on a surface of an object composed of a substrate material, comprising the steps of:

(a) preparing a solution by saturating a solvent with the substrate material at a first temperature and compounding the saturated solvent with the layer material;

(b) heating, separately, the solution prepared according to step (a) and the surface of the object to a second temperature; and (c) bringing the heated surface of the object into contact with the heated solution to effect the deposition of layer material on the surface of the object at the second temperature;

wherein (i) the composition of the substrate material is different from the composition of the layer material;

(ii) the first temperature is higher than the melting point of the solvent but lower than the melting point of the layer material;

(iii) the second temperature is higher than the first temperature but is lower than the melting temperature of the substrate material and is also lower than or equal to the melting temperature of the layer material; and (iv) at the second temperature, the surface energy of the solution is less than the surface energy of the layer material and the surface energy of the layer material is less than or equal to the surface energy of the substrate material.

2. The method as set forth in claim 1, characterized in that a metal or a metal alloy is used as said solvent.

3. The method as set forth in claim 1 or 2, characterized in that silicon is used as said substrate material, Germanium as said layer material and bismuth, gallium, indium, lead, antimony, tin or alloys of these metals are used one with the other or with other metals having a higher surface energy and/or solubility for Ge and Si as said solvent.

* * * * *

UNITED STATES PATENT AND TRADEMARK OFFICE
CERTIFICATE OF CORRECTION

PATENT NO. : 5,513,593
DATED : May 7, 1996
INVENTOR(S) : Hansson et al.

It is certified that error appears in the above-indentified patent and that said Letters Patent is hereby corrected as shown below:

<u>Title page, Item 56</u>, at end of listing of OTHER PUBLICATIONS insert --DeSalvo, G.C. Analysis and Demonstration of Surface Passivation Options for Gallium Arsenide Solar Cells. Dissertation, University of Delaware, Newark, DE (1989), pp. 39 and 110-127.--.

Signed and Sealed this

Sixteenth Day of September, 1997

Attest:

BRUCE LEHMAN

*Attesting Officer*     *Commissioner of Patents and Trademarks*